(12) United States Patent
Kim et al.

(10) Patent No.: US 7,045,850 B2
(45) Date of Patent: May 16, 2006

(54) SEMICONDUCTOR DEVICE WITH FLOATING TRAP TYPE NONVOLATILE MEMORY CELL AND METHOD FOR MANUFACTURING THE SAME

(75) Inventors: Sang-Su Kim, Suwon-si (KR); Kwang-Wook Koh, Seongnam-si (KR); Geum-Jong Bae, Suwon-si (KR); Ki-Chul Kim, Suwon-si (KR); Sung-Ho Kim, Osan-si (KR); Jin-Hee Kim, Seongnam-si (KR); In-Wook Cho, Yongin-si (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/844,783

(22) Filed: May 13, 2004

(65) Prior Publication Data

US 2005/0023604 A1    Feb. 3, 2005

(30) Foreign Application Priority Data

Jul. 30, 2003    (KR) ............... 10-2003-0052896

(51) Int. Cl.
*H01L 29/76* (2006.01)

(52) U.S. Cl. ..................................... 257/314

(58) Field of Classification Search ........ 257/314–321, 257/E21.179, E21.422, E21.68, E21.681, 257/E21.683, E21.686, E21.687, E21.688, 257/E21.689; 438/257–267

See application file for complete search history.

(56) References Cited

U.S. PATENT DOCUMENTS

| 5,658,812 | A | * | 8/1997 | Araki ..................... 438/258 |
| 5,861,347 | A | * | 1/1999 | Maiti et al. ............. 438/787 |
| 6,165,846 | A | * | 12/2000 | Carns et al. ............ 438/264 |
| 6,177,362 | B1 | * | 1/2001 | Huang et al. ........... 438/787 |

FOREIGN PATENT DOCUMENTS

| JP | 10-313106 | 11/1998 |
| JP | 2001-007305 | 1/2001 |
| KR | 00176176 | 11/1998 |
| KR | 2002-0073959 | 9/2002 |

* cited by examiner

*Primary Examiner*—Brook Kebede
(74) *Attorney, Agent, or Firm*—Mills & Onello LLP

(57) ABSTRACT

The present invention discloses a semiconductor device having a floating trap type nonvolatile memory cell and a method for manufacturing the same. The method includes providing a semiconductor substrate having a nonvolatile memory region, a first region, and a second region. A triple layer composed of a tunnel oxide layer, a charge storing layer and a first deposited oxide layer on the semiconductor substrate is formed sequentially The triple layer on the semiconductor substrate except the nonvolatile memory region is then removed. A second deposited oxide layer is formed on an entire surface of the semiconductor substrate including the first and second regions from which the triple layer is removed. The second deposited oxide layer on the second region is removed, and a first thermal oxide layer is formed on the entire surface of the semiconductor substrate including the second region from which the second deposited oxide layer is removed. The semiconductor device can be manufactured according to the present invention to have a reduced processing time and a reduced change of impurity doping profile. The thickness of a blocking oxide layer and a high voltage gate oxide layer can be controlled.

5 Claims, 5 Drawing Sheets

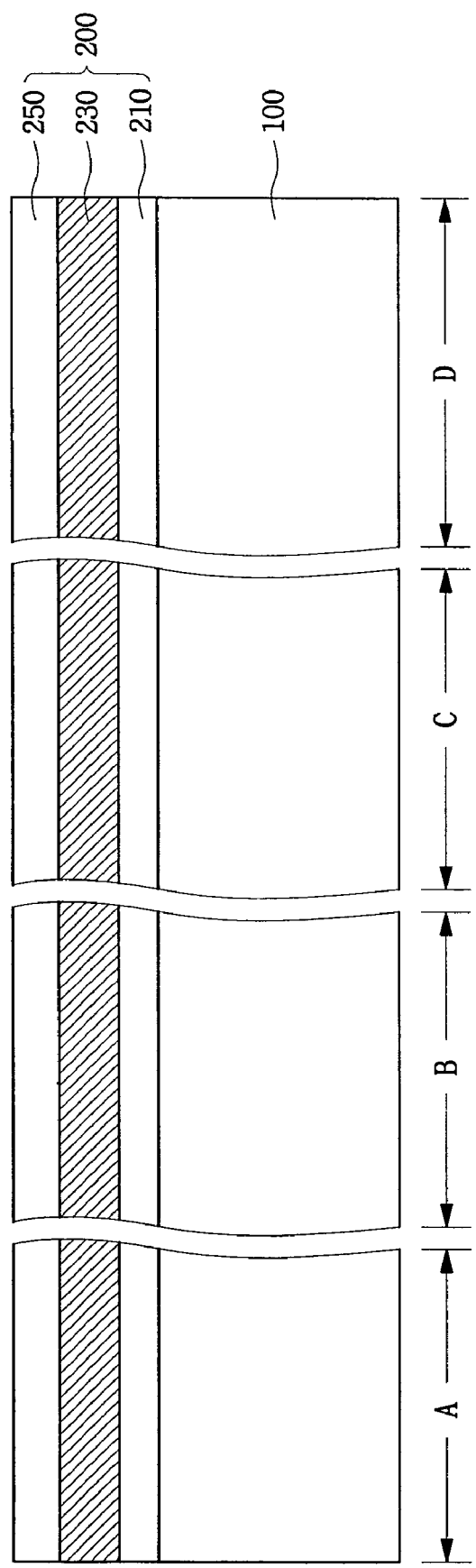

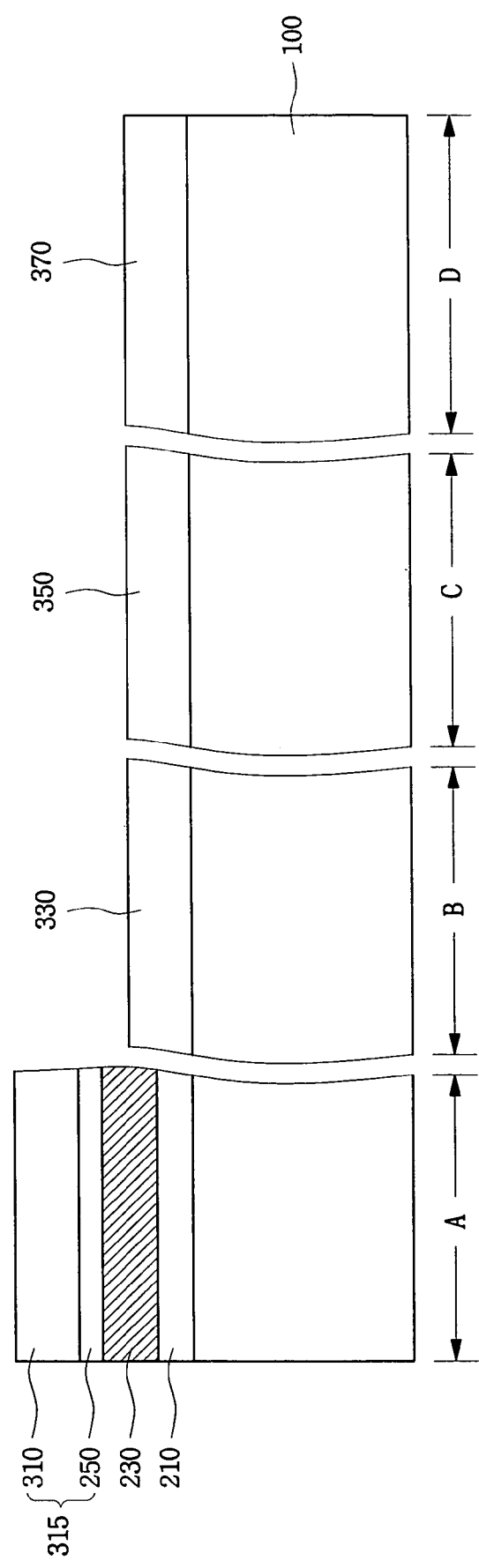

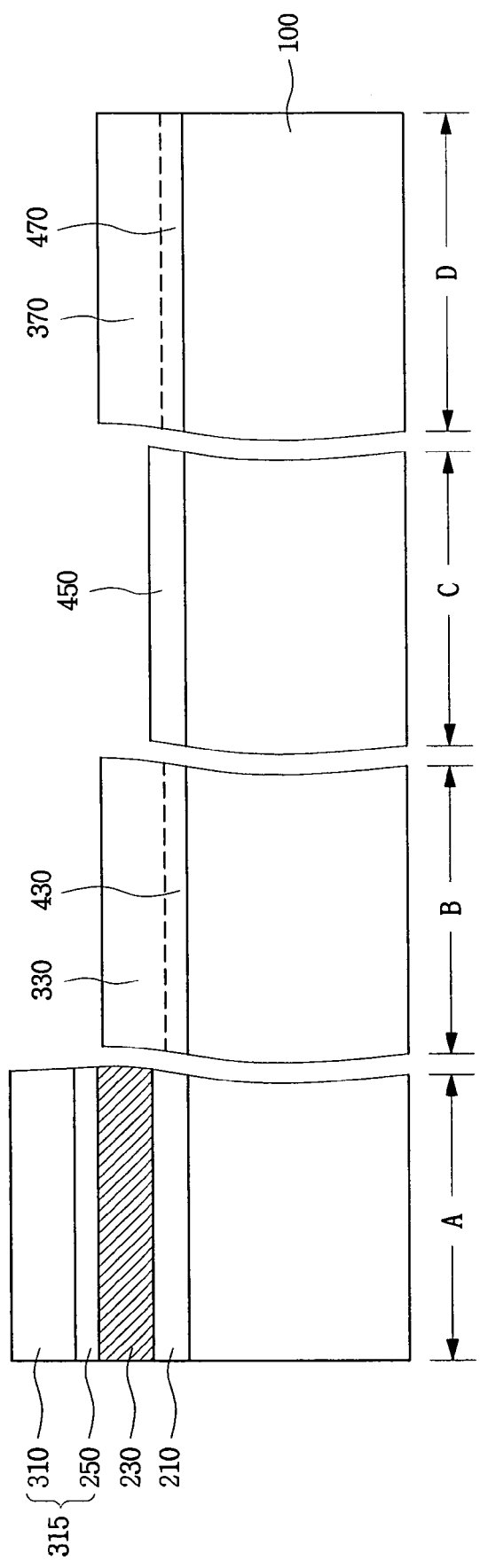

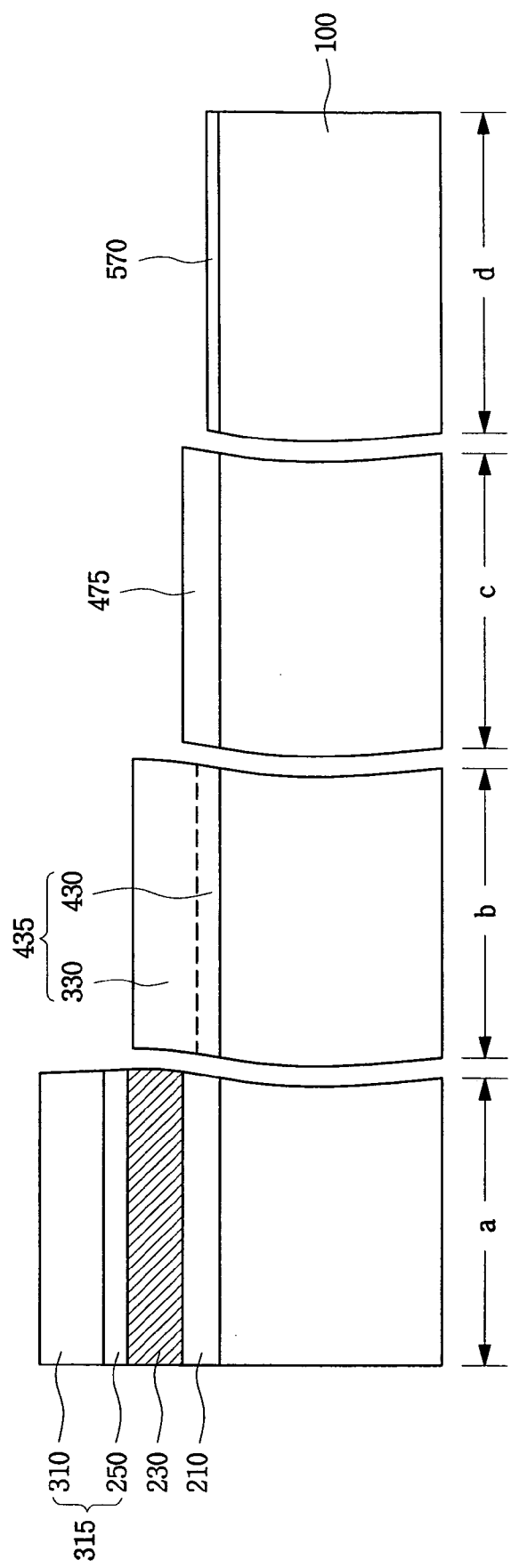

SEMICONDUCTOR DEVICE WITH FLOATING TRAP TYPE NONVOLATILE MEMORY CELL AND METHOD FOR MANUFACTURING THE SAME

CROSS-REFERENCE TO RELATED APPLICATION

This application claims the benefit of Korean Patent Application No. 2003-52896, filed on Jul. 30, 2003, the contents of which are hereby incorporated herein by reference in their entirety.

BACKGROUND OF THE INVENTION

1. Field of the Invention

The present invention relates to a semiconductor device and a method for manufacturing the same and, more particularly, to a semiconductor device having a floating trap type nonvolatile memory cell and a method for manufacturing the same.

2. Description of the Related Art

A nonvolatile memory such as a flash memory can maintain data until a removal operation is performed after the data are input. Therefore, the nonvolatile memory does not require a refresh operation so that power consumption can be reduced compared to a volatile memory such as a Dynamic Random Access Memory (DRAM).

However, a high voltage is typically required to be applied to the nonvolatile memory in order to write and erase the data in a cell, and a separate and reliable storing space is required to maintain the data. Thus, a semiconductor device having the nonvolatile memory cell consists of regions for applying different voltages such as a region for applying a high voltage to write and erase the data, a region for applying a low voltage for implementing high-speed operation of the semiconductor device, and a region for applying a medium voltage like an I/O circuit region having a voltage between the high and low voltages as well as a cell region.

The nonvolatile memory cell may be classified as a floating gate type or a floating trap type according to the storing space. The floating trap type nonvolatile memory cell stores charges in a trap formed in a non-conductive charge storing layer, while the floating gate type nonvolatile memory cell stores the charges in a polysilicon layer. A representative SONOS (Silicon Oxide Nitride Oxide Semiconductor) cell of the floating trap type nonvolatile memory cell has a gate pattern composed of a tunnel oxide layer, a silicon nitride layer as a charge storing layer, a blocking oxide layer and a conductive layer deposited on a silicon substrate sequentially.

In the process of manufacturing the semiconductor device having the SONOS cell, the blocking oxide layer is preferably formed of a CVD oxide layer, and all of a high voltage gate oxide layer formed on the high voltage region, a medium voltage gate oxide layer formed on the medium voltage region, and a low voltage gate oxide formed on the low voltage region are formed with different thicknesses. The thickest high voltage gate oxide layer may be formed of a thermal oxide layer only. But, in this case, teh time duration of forming the high voltage gate oxide layer is too long, and, as a result, the impurity profile in the substrate can be changed significantly. Also, the thickest high voltage gate oxide layer may be formed of a CVD oxide layer only. But, in this case, in consideration of the nature of the CVD oxide layer formed on an entire surface of the substrate, it also causes the thickness of the blocking oxide layer to be increased. In addition, the blocking oxide layer and the high voltage gate oxide layer, which are formed of the deposited oxide layer, are easily etched in a subsequent wet-etching process, thereby making it difficult to control the final thickness thereof.

SUMMARY OF THE INVENTION

The present invention provides a semiconductor device having a reduced processing time and having reduced change in doping profile during processing, and having a high voltage gate oxide layer without increasing a thickness of a blocking oxide layer, and a method for manufacturing the same.

The present invention also provides a semiconductor device capable of suppressing etching and controlling the thickness thereof in an etching process of a blocking oxide layer and a high voltage gate oxide layer, and a method for manufacturing the same.

The present invention is directed to a semiconductor device having a floating trap type nonvolatile memory cell. The semiconductor device comprises a substrate including a first region, a second region and a nonvolatile memory region; a memory gate pattern having a tunnel oxide layer, a charge storing layer, a blocking oxide layer and a conductive layer sequentially deposited on the nonvolatile memory region, the blocking oxide layer containing nitride atoms; a first gate pattern having a first gate oxide layer and a conductive layer sequentially deposited on the first region, the first gate oxide layer containing nitride atoms; and a second gate pattern having a second gate oxide layer and a conductive layer sequentially deposited on the second region.

In one embodiment, the substrate further includes a third region and a third gate pattern having a third gate oxide layer and a conductive layer sequentially deposited on the third region. The third gate oxide layer can be a silicon oxynitride layer.

The tunnel insulating layer may be a silicon oxide layer or a silicon oxynitride layer. The charge storing layer may be formed of a material selected from a group consisting of a hafnium oxide layer, an aluminum oxide layer, and a silicon nitride layer.

The present invention also provides a method for manufacturing a semiconductor device having a floating trap type nonvolatile memory cell, which comprises the steps of providing a semiconductor substrate including a nonvolatile memory region, a first region, and a second region; forming a triple layer having a tunnel oxide layer, a charge storing layer and a first deposited oxide layer sequentially deposited on the semiconductor substrate; removing the triple layer on the semiconductor substrate except in the nonvolatile memory region; forming a second deposited oxide layer on the surface of the semiconductor substrate including the first and second regions from which the triple layer is removed; removing the second deposited oxide layer on the second region; and forming a first thermal oxide layer on the surface of the semiconductor substrate including the second region from which the second deposited oxide layer is removed.

The method may further comprise the step of, after forming the first thermal oxide layer, removing the first thermal oxide layer and the second deposited oxide layer on the third region. A second thermal oxide layer is formed on the surface of the semiconductor substrate including the third region.

The second thermal oxide layer can be formed of a silicon oxynitride layer.

The tunnel oxide layer may be formed of a silicon oxide layer or a silicon oxynitride layer. The charge storing layer may be formed of a material selected from a group consisting of a hafnium oxide layer, an aluminum oxide layer, and a silicon nitride layer.

The first deposited oxide layer can be formed using CVD (chemical vapor deposition) or ALD (atomic layer deposition).

The thermal treatment for the first deposited oxide layer formed on the charge storing layer can be performed in a gas atmosphere containing a nitride compound, before removing the triple layer on the semiconductor layer except in the nonvolatile memory region. In this case, the nitride compound can include one or more material selected from a group consisting of $N_2O$, $NO_2$, NO, and $NH_3$. The thermal treatment can be performed at a temperature of 800° C. or more. The thermal treatment can be performed at a temperature of 800° C. to 900° C.

The second deposited oxide layer may be formed using CVD or ALD.

A thermal treatment for the second deposited oxide layer formed on the surface of the semiconductor substrate can be performed in the gas atmosphere containing the nitride compound, before removing the second deposited oxide layer on the second region. In this case, the nitride compound can be one or more material selected from a group consisting of $N_2O$, $NO_2$, NO, and $NH_3$. The thermal treatment can be performed at a temperature of 800° C. or more. The thermal treatment can be performed at a temperature of 800° C. to 900° C.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention. FIG. 1a to FIG. 1e are cross-sectional views illustrating a method for manufacturing a semiconductor device having a floating trap type nonvolatile memory cell in accordance with one embodiment of the present invention.

DETAILED DESCRIPTION OF THE INVENTION

Figure 1E:
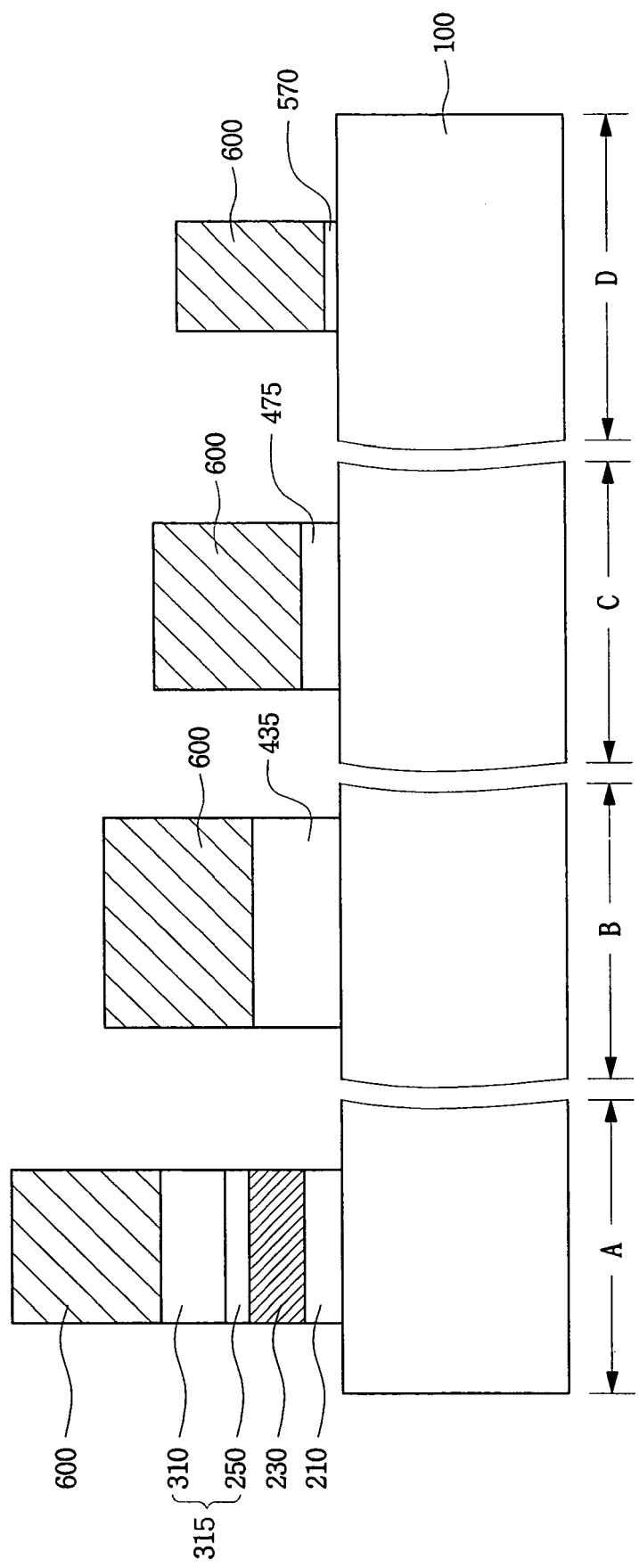

The present invention will now be described more fully hereinafter with reference to the accompanying drawings, in which preferred embodiments of the invention are shown. In the drawings, the thickness of layers and regions are exaggerated for clarity. FIG. 1a to FIG. 1e are cross-sectional views illustrating a method for manufacturing a semiconductor device having a floating trap type nonvolatile memory cell in accordance with one embodiment of the present invention.

Referring to FIG. 1a, a semiconductor substrate 100 comprising a nonvolatile memory region A, a first region B, and a second region C is provided. The semiconductor substrate 100 may further comprise a third region D. Each of the first region B, the second region C, and the third region D has a different voltage applied. More specifically, the first region B and the third region D have a high voltage and low voltage, respectively, applied. The second region C has applied a medium voltage between the high voltage and the low voltage. The first region B may be a region where a circuit is formed for applying a voltage required to write or erase data in the nonvolatile memory cell, the second region C may be a region where an I/O circuit of the semiconductor device is formed, and the third region D may be a region where a circuit is formed for implementing high-speed operation of the semiconductor device.

A well impurity and a channel impurity are implanted into a predetermined region of the semiconductor device 100 to form a well region (not shown) and channel impurity region (not shown), respectively. The implantation of the channel impurity is performed for controlling threshold voltage.

A tunnel insulating layer 210, a charge storing layer 230 and a first deposited oxide layer 250 are deposited on the semiconductor substrate 100 sequentially where the well and channel impurity regions are already formed, thereby forming a triple layer 200.

The tunnel insulating layer 210 may be formed of silicon oxide or silicon oxynitride. Preferably, the tunnel insulating layer 210 is formed of thermal oxide. The charge storing layer 230 is preferably formed of a material having a high dielectric constant such as silicon nitride, hafnium oxide, or aluminum oxide.

The first deposited oxide layer 250 is preferably formed using CVD (chemical vapor deposition) or ALD (atomic layer deposition).

The first deposited oxide layer 250 is then preferably subject to a thermal treatment in a gas atmosphere containing a nitride compound. As a result, the first deposited oxide layer 250 contains nitride atoms, so that the quality of the first deposited oxide layer 250 can be dense. Thus, the thickness reduction of the first deposited oxide layer 250 due to subsequent wet-etching processes such as a process of removing photoresist and a process of cleaning the substrate can be suppressed. Consequently, the deposition thickness of the first deposited oxide layer 250 can be reduced and the final thickness of the first deposited oxide layer 250 can be controlled. Preferably, the first deposited oxide layer 250 is formed in a range of 50 to 100 Å thickness.

The degree of suppressing the thickness reduction of the first deposited oxide layer 250 may be controlled by the amount of the nitride atoms introduced in the first deposited oxide layer 250. To adjust the amount of nitride atoms introduced into the first deposited oxide layer 250, the amount of nitride compound in the thermal treatment process can be adjusted. The nitride compound may be one ore more materials selected from a group consisting of $N_2O$, $NO_2$, NO, and $NH_3$. The gas containing the nitride compound may further comprise an inert gas. The thermal treatment is preferably performed at a temperature of 800° C. or more. Specifically, the thermal treatment can be performed at a temperature of 800° C. to 900° C. In addition, the thermal treatment is performed for about half an hour to two hours. The thermal treatment may be immediately performed in equipment for forming the first deposited oxide layer 250 such as CVD equipment or may be performed in other equipment such as a heating furnace, after forming the first deposited oxide layer 250.

Referring to FIG. 1b, a first photoresist pattern (not shown) exposing the triple layer 200 formed on the first, the second and the third regions B, C, D is formed. The exposed triple layer 200 is removed to expose the first, the second and the third regions B, C, D of the substrate 100. Then the first photoresist pattern is removed so that the first deposited oxide layer 250 of the nonvolatile memory region A is exposed. The substrate 100 where the first deposited oxide layer 250 of the nonvolatile memory region A is exposed is cleaned. As described above, in the wet-etching processes such as the process of removing the first photoresist pattern and the process of cleaning the substrate 100, a thickness reduction of the exposed first deposited oxide layer 250 is suppressed. Also, the first deposited oxide layer 250 prevents a surface of the charge storing layer 230 from being damaged in the wet-etching processes.

Subsequently, second deposited oxide layers 310, 330, 350, and 370 are formed on the exposed first deposited oxide layer 250 of the nonvolatile memory region A, the first, the second and the third regions B, C, D, respectively. The second deposited oxide layers 310, 330, 350, and 370 are preferably formed by using CVD (chemical vapor deposition) or ALD (atomic layer deposition).

The second deposited oxide layers 310, 330, 350, and 370 are then preferably subject to a thermal treatment in a gas atmosphere containing a nitride compound. Therefore, the second deposited oxide layers 310, 330, 350, and 370 contain nitride atoms, and the quality of the layers becomes dense at the same time. Thus, the thickness reduction of the second deposited oxide layers 310, 330, 350, and 370 due to subsequent wet-etching processes such as a process of removing the photoresist and a process of cleaning the substrate can be suppressed. Consequently, the deposition thickness of the second deposited oxide layers 310, 330, 350, and 370 can be reduced and the final thickness thereof can be controlled. Preferably, the second deposited oxide layers 310, 330, 350, and 370 are formed in a range of 80 to 150 Å thickness.

The degree of suppressing the thickness reduction of the second deposited oxide layers 310, 330, 350, and 370 may be controlled by an amount of the nitride atoms introduced therein. The amount of nitride atoms introduced into the second deposited oxide layers 310, 330, 350, and 370 can be adjusted by adjusting the amount of nitride compound in the thermal treatment process. The nitride compound may be one ore more material selected from a group consisting of $N_2O$, $NO_2$, $NO$, and $NH_3$. The gas atmosphere containing the nitride compound may further comprise an inert gas. The thermal treatment is preferably performed at a temperature of 800° C. or more. More preferably, the thermal treatment is performed at a temperature of 800° C. to 900° C. In addition, the thermal treatment is performed for about half an hour to two hours. The thermal treatment may be immediately performed in equipment for forming the second deposited oxide layers 310, 330, 350, and 370 or may be performed in a heating furnace, after forming the second deposited oxide layers 310, 330, 350, and 370.

The second deposited oxide layer 310 formed on the nonvolatile memory region A and the first deposited oxide layer 250 under the second deposited oxide layer 310 form a blocking oxide layer 315. As mentioned above, the first deposited oxide layer 250 and the second deposited oxide layer 310 are thermally treated in the gas atmosphere containing the nitride compound so that the final thickness control of the first deposited oxide layer 250 and the second deposited oxide layer 310 is facilitated, thereby making it possible to control the thickness of the blocking oxide layer 315. As a result, an electrical characteristic such as a data retention characteristic of the nonvolatile memory cell can be improved.

In addition, as mentioned above, the final thickness control of the second deposited oxide layer 330 is facilitated, such that it is possible to obtain a reliable gate oxide layer in the first region B.

Referring to FIG. 1c, a second photoresist pattern (not shown) is formed on the substrate 100 to expose the second deposited oxide layer 350 of the second region C. The exposed the second deposited oxide layer 350 of the second region C is removed using the second photoresist pattern as a mask to expose a surface of the substrate 100 of the second region C. Subsequently, the second photoresist pattern is removed so that the second deposited oxide layer 310, 330, and 370 are exposed. The substrate 100 where the second deposited oxide layer 310, 330, and 370 are exposed is cleaned. In the wet-etching processes such as the process of removing the second photoresist pattern and the process of cleaning the substrate 100, a thickness reduction of the exposed the second deposited oxide layer 310, 330, and 370 is suppressed.

Subsequently, the substrate 100 having the exposed the surface of the substrate 100 of the second region C and the exposed the second deposited oxide layers 310, 330, and 370 is thermally oxidized to form first thermal oxide layers 430, 450, and 470. The first thermal oxide layer 430 is formed between the second deposited oxide layer 330 and the substrate 100 of the first region B, the first thermal oxide layer 450 is formed on the exposed surface of the substrate 100 of the second region C, and the first thermal oxide layer 470 is formed between the second deposited oxide layer 370 and the substrate 100 of the third region D. But the first thermal oxide layer is not formed on the nonvolatile memory region A, because a silicon supplying source is blocked by the charge storing layer 230 in the nonvolatile memory region A. Therefore, the thickness of the blocking oxide layer 315 in the nonvolatile memory region A does not increase.

The first thermal oxide layers 430 and 470 formed on the first and third regions B, D have a thickness thinner than the first thermal oxide layer 450 formed on the second region C. This result occurs because nitride atoms introduced into the second deposited oxide layers 330 and 370 are mainly distributed at an interface between the second deposited oxide layers 330, 370 and the substrate 100 under the second deposited oxide layers 330 and 370 so that these nitride atoms prevent oxygen atoms from penetrating in a process of forming the thermal oxide layer. In addition, growth thickness of the first thermal oxide layers 430 and 470 can be adjusted based on the amount of nitride atoms introduced into the second deposited oxide layers 330 and 370.

The first thermal oxide layer 450 on the second region C is preferably formed in a range of 50 to 150 Å thickness. In this case, the first thermal oxide layers 430 and 470 on the first region B and the third region D are formed in a range of 25 to 50 Å thickness, respectively, when the amount of nitride atoms introduced into the second deposited oxide layers 330 and 370 is less than 1 atom %.

As a result, the total thickness of the oxide layers 330, 430 formed on the first region B can be adjusted without increasing the thickness of the blocking oxide layer 315 of the nonvolatile memory region A. In addition, on the first region B, the second deposited oxide layer 330 is formed using the deposition method and the first thermal oxide layer 430 is formed using the thermal oxidation method, so that processing time and profile change of impurities implanted into the substrate 100 can be reduced compared to the case that the oxide layers 430, 330 are formed using only the thermal oxidation method.

Referring to FIG. 1d, a third photoresist pattern (not shown) is formed on the substrate 100 to expose the second deposited oxide layer 370 of the third region D. The exposed the second deposited oxide layer 370 and the first thermal oxide layer 470 under the second deposited oxide layer 370 are removed using the third photoresist pattern as a mask, so that the substrate 100 of the third region D is exposed. The third photoresist pattern is then removed. Thereafter, the substrate 100 where the third photoresist pattern is already removed is cleaned and thermally oxidized to form second thermal oxide layers. On the third region D, the second thermal oxide layer 570 is formed. The second thermal oxide layer 570 has preferably less than 40 Å in thickness. Therefore, the second thermal oxide layer (not shown) may be slightly formed on the first and the second region B, C. Furthermore, a supply of silicon is blocked in the nonvolatile memory region A so that the second thermal oxide layer is not formed on the nonvolatile memory region A. The second thermal oxide layer 570 is preferably formed of a silicon oxynitride layer.

The second deposited oxide layer 330, the first thermal oxide layer 430, and the second thermal oxide layer (not shown), which are formed on the first region B form a first gate oxide layer, that is, a high voltage gate oxide layer 435. And the first thermal oxide layer 450 and the second thermal oxide layer (not shown) formed on the second region C form a second gate oxide layer, that is, a medium voltage gate oxide layer 475. In addition, the second thermal oxide layer 570 formed on the third region D forms a third gate oxide layer, that is, a low voltage gate oxide layer 570.

Referring to FIG. 1*e*, a conductive layer 600 is formed on the substrate 100 on which the second thermal oxide layer 570 is formed. A fourth photoresist patterns (not shown) is then formed on the conductive layer 600 to expose predetermined portions of the conductive layer. The exposed conductive layer 600, the oxide layers 315, 435, 475, 570 under the exposed conductive layer 600, the charge storing layer 230 and the tunnel oxide layer 210 are etched using the forth photoresist pattern as a mask to form a memory gate pattern on the nonvolatile memory region A, a first gate pattern on the first region B, a second gate pattern on the second region C and a third gate pattern on the third region D. The memory gate pattern includes the tunnel oxide layer 210, the charge storing layer 230, the blocking oxide layer 315 containing nitride atoms and a conductive layer 600 deposited in this order. The first gate pattern, that is, the high voltage gate pattern, has the high voltage gate oxide layer 435 containing nitride atoms and the conductive layer 600 deposited in this order. The second gate pattern, that is, the medium voltage gate pattern, has the medium voltage gate oxide layer 475 and a conductive layer 600 deposited in this order. The third gate pattern, that is, the low voltage gate pattern, has the low voltage gate oxide layer 570 and a conductive layer 600 deposited in this order.

As described above, by forming the thermal oxide layer after the deposited oxide layer is formed in a process of forming the high voltage gate oxide layer, the semiconductor device can be manufactured to have a reduced processing time and a reduced change of impurity doping profile. The thickness of the high voltage gate oxide layer is adjusted without increasing the thickness of the blocking oxide layer.

In addition, as mentioned above, the thickness reduction of the blocking oxide layer and the high voltage gate oxide layer in wet-etching processes such as a process of removing the photoresist and a cleaning process is suppressed, so that the final thickness control of the blocking oxide layer and the high voltage gate oxide layer is facilitated. As a result, the electrical characteristic such as a data retention characteristic of the nonvolatile memory cell can be improved, and a reliable high voltage gate oxide layer on the high voltage region can be obtained.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device, comprising:
    a substrate including a nonvolatile memory region, a first region, and a second region;
    a memory gate pattern having a tunnel oxide layer, a charge storing layer, a blocking oxide layer and a conductive layer sequentially deposited on the nonvolatile memory region, the blocking oxide layer having first and second oxide layers, the first and second oxide layers containing nitride atoms;
    a first gate pattern having a first gate oxide layer and a conductive layer sequentially deposited on the first region, the first gate oxide layer containing nitride atoms; and
    a second gate pattern having a second gate oxide layer and a conductive layer sequentially deposited on the second region.

2. The semiconductor device according to claim 1, wherein the substrate further includes a third region, a third gate pattern having a third gate oxide layer and a conductive layer sequentially-deposited on the third region.

3. The semiconductor device according to claim 2, wherein the third gate oxide layer is formed of silicon oxynitride.

4. The semiconductor device according to claim 1, wherein the tunnel insulating layer is formed of one of silicon oxide and silicon oxynitride.

5. The semiconductor device according to claim 1, wherein the charge storing layer is formed of a material selected from a group consisting of hafnium oxide, aluminum oxide, and silicon nitride.

* * * * *